United States Patent [19]

van den Enden et al.

[11] 4,081,855

[45] Mar. 28, 1978

[54] CURRENT PULSE GENERATOR

[75] Inventors: Adrianus Wilhelmus Maria van den Enden; Edmond de Niet; Marinus Adriaan Deurwaarder, all of Eindhoven, Netherlands

[73] Assignee: U.S. Philips Corporation, New York, N.Y.

[21] Appl. No.: 699,668

[22] Filed: Jun. 25, 1976

Related U.S. Application Data

[63] Continuation of Ser. No. 543,112, Jan. 22, 1975, abandoned.

[30] Foreign Application Priority Data

Feb. 1, 1974 Netherlands .......................... 7401400

[51] Int. Cl.² ............................................ H01H 47/32
[52] U.S. Cl. ..................................... 361/203; 361/156
[58] Field of Search ....................... 361/152, 156, 203; 331/165, 166

[56] References Cited

U.S. PATENT DOCUMENTS

| 3,050,639 | 8/1962 | Tate | 331/165 X |
| 3,200,350 | 8/1965 | Sharp | 331/166 |

*Primary Examiner*—Harry E. Moose, Jr.
*Attorney, Agent, or Firm*—Frank R. Trifari; Daniel R. McGlynn

[57] ABSTRACT

The invention relates to a device for generating a time-dependent current in a coil, for example, a magnetic coil. Such a magnetic coil can be used, in combination with a second coil of this kind, for generating rotary magnetic fields in a device for transporting magnetic bubbles along a bubble guide structure consisting of discrete elements on a plate of magnetic material. The device comprises two or more current connection terminals, an LC oscillator circuit, a switching element connected in series with the coil, and a control unit.

4 Claims, 6 Drawing Figures

CURRENT PULSE GENERATOR

This is a continuation of application Ser. No. 543,112, filed Jan. 22, 1975, now abandoned.

The invention relates to a device for generating a time-dependent current in a coil, preferably a magnetic coil for use in a device for generating a rotary magnetic field, comprising at least two current connection terminals, an oscillator circuit comprising a capacitor besides the said coil, at least one control terminal which can be connected to an output of a control unit, a signal on the said control terminal being capable of operating a switching device connected thereto in order to switch the said current, and a control unit whereby the current range can be regulated. A device of this kind is known from the published Netherlands patent application No. 7209154. The known device comprises, connected in series with the coil, an auxiliary coil and parallel thereto a field current amplifier which has a class-C operating characteristic. Furthermore, a switching element is connected parallel across the series connection of the two coils and the capacitor. In the rest state the capacitor is always charged, and the current through the coil is blocked. This is often a drawback. The invention has for its object to energize the coil also in the rest state, and to this end it is characterized in that the said switching device and control device constitute a controllable current source circuit which is connected in series with a first rectifying element and the said oscillator circuit which is constructed as a parallel circuit. This current source circuit can be readily controlled, while the current is limited by the control device. Only few components are required, and more control modes are possible than in the known device. An accurately defined current program, and hence a specific magnetic field program, are very suitable, for example, for use in a device for storing and manipulating binary information in the form of magnetic bubbles which can be driven in a plate of magnetic material along a bubble guide structure consisting of discrete elements, for example, as described in copending U.S. application Ser. No. 522,051 in the name of applicants. It is advantageous if the direction of rotation of the rotary magnetic field can be reversed starting from different positions. Because a current, and hence a magnetic field, is also sustained in the rest state, the bubbles will then occupy well-defined positions and will not be substantially influenced by irregularities in the plate material or the bubble guide structure.

It is advantageous if the oscillator circuit can be critically damped by a series connection of a resistor and a second rectifying element which is conductive in the same direction as the first rectifying element, the said series connection being connected parallel to the oscillator circuit and the first rectifying element. After the current source circuit has been rendered conducting, no undesired ringing can occur, the control signals can quickly succeed each other, and the logic state of the magnetic field is properly defined.

It is advantageous if the said signal is capable of setting the switching device to the interrupt state for a period of time of between one half and one whole period of the natural frequency of the oscillator circuit. Using such a control mode, complying with broad tolerances, exactly one oscillation period can be completed.

It is advantageous if at least three current connection terminals of successive potential are provided, the said switching device comprising two switching elements and the said control device comprising two control elements which each time pair-wise form a controllable current source element, the controllable current source element being each time connected in series with a rectifying element between a current connection terminal of extreme potential and a first connection of the coil, a second connection of the coil being connected to a third current connection terminal of intermediate potential. In that case the current through the coil can have two directions in the rest state, with the result that a high degree of programmability is obtained.

It is advantageous if the said signal is capable of simultaneously setting each time one of the said controllable current source elements to the interrupt state and one to the conducting state. This results in a simple control mode.

The invention also relates to a device for generating a rotary magnetic field, comprising at least two coils whereby magnetic fields which are transverse to each other can be generated in a working region, each of the coils forming part of a device as described, so that very varied field programming can be achieved. In the case of two coils, the direction of rotation can be reversed at 2 or 4 different orientation.

It is then advantageous if at least one coil forms part of a device as described, at least one second coil forming part of an oscillator circuit composed of a series connection of a capacitor, a switching element which is bridged by a rectifying element, and the said second coil, the connections of the latter capacitor being connected to two current connection terminals. If the reversal of the direction of rotation is not necessary, a simple device is thus obtained in which the other advantages of the invention are maintained. A magnetic field can remain present in the rest state.

It is advantageous if the current of a controllable current source circuit can be adjusted to a rest value by a second signal. This saves energy.

The invention will be described in detail hereinafter with reference to some figures.

Figure 1:
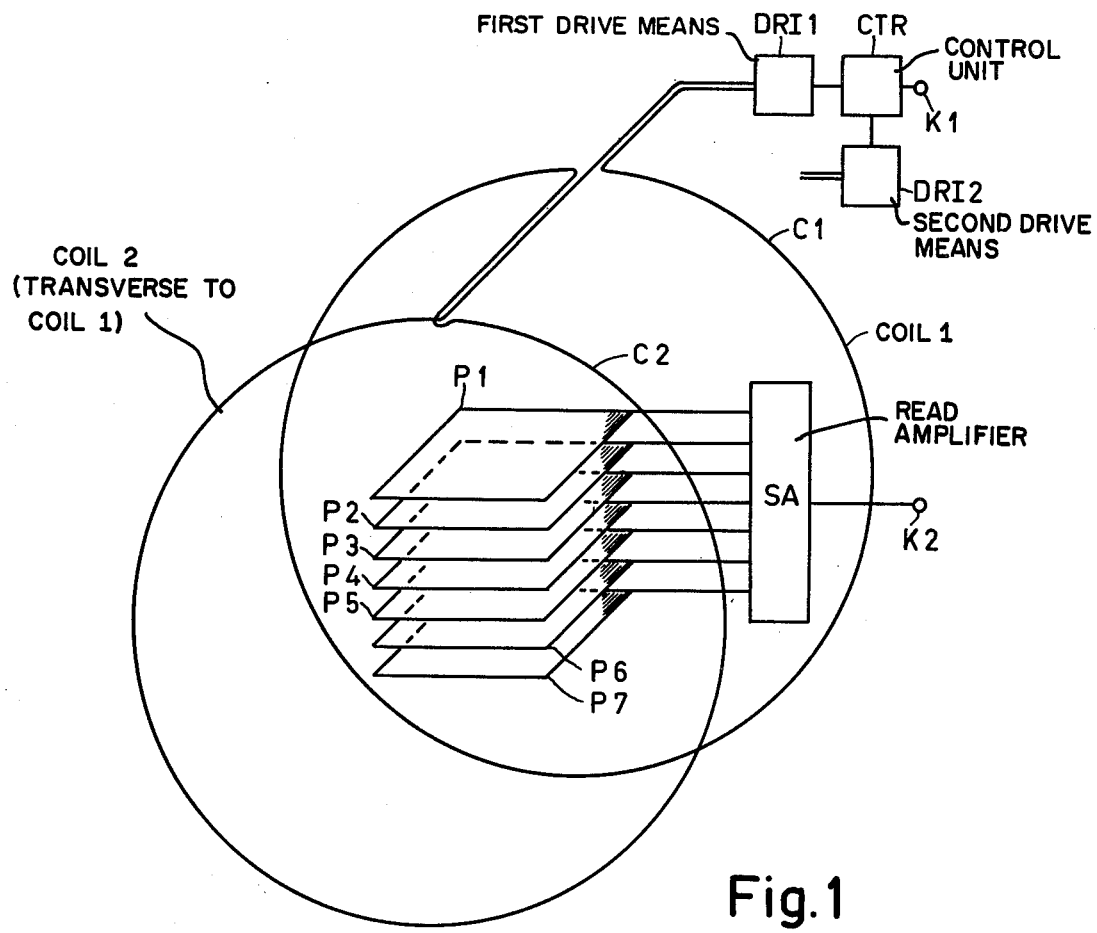
FIG. 1 shows a storage device comprising magnetic coils whereby a rotary magnetic field can be generated.

FIG. 1 shows a storage device as described in the previous U.S. application in the name of applicant, comprising an information input terminal K1, a control unit CTR, two rotary magnetic field generators DRI1, 2, seven plates of magnetic material P1 . . . 7, a read amplifier device SA, two electrically series-connected Helmholtz coils C1,2, and an information output terminal K2. The electrically interconnected Helmoltz coils are simultaneously energized and hence constitute a single coil in the content of the present invention. There are also provided a main magnetic field generator (not shown) and a second pair of Helmholtz coils which is directed transverse to the first pair. The main magnetic field generator may be a permanent magnet, the field of which is directed transverse to the plates P1 ... 7. Magnetic bubbles can be sustained in the plates of magnetic material by the main magnetic field. Information can be received on terminal K1. This information is processed in the control unit CTR so as to form control signals which are applied to the rotary magnetic field generators DRI1, 2. The rotary magnetic field generator DRI1 applies time-dependent currents to the Helmholts coils C1,2, whereby a magnetic field component is generated which is parallel to the side of the plates P1 ... 7 shown in perspective. Helmholts coils produce a substantially homogeneous field in a working region near their centre plane and the axis of rotation. Analogously, two Helmholts coils (not shown) can produce an homogeneous field which is parallel to the plane of the drawing and the plates of magnetic material P1 ... 7. Magnetic fields can be generated in all directions in the plane of the plates P1 ... 7 by cooperation of the four Helmholtz coils.

By way of given rotary magnetic field sequences, the bubbles present on the plates P1 ... 7 can be driven along a bubble guide structure provided thereon (not shown) and consisting of discrete elements. This structure may comprise a switching device along which bubbles can be driven as desired. If the various plates comprise diverging switches, shifted or not shifted with respect to each other, each plate can also be controlled in a specific manner. A specific code can thus be formed for each of the plates.

The plates furthermore comprise detection elements which are connected, via detection lines, to the read amplifier device SA. This device applies the amplified read signals to terminal K2.

Besides a device as shown in FIG. 1, a device comprising three sets of Helmholtz coils is alternatively possible. The third set can then generate a field in the direction of a said main magnetic field. By cooperation of the three magnetic field components, a resultant magnetic field having any arbitrary direction can then be generated in the working region. Arbitrary rotations of the resultant magnetic field can be obtained by suitable time-dependent currents. For given applications, four or more sets of Helmholtz coils (or other coils) can be used.

Figure 2:
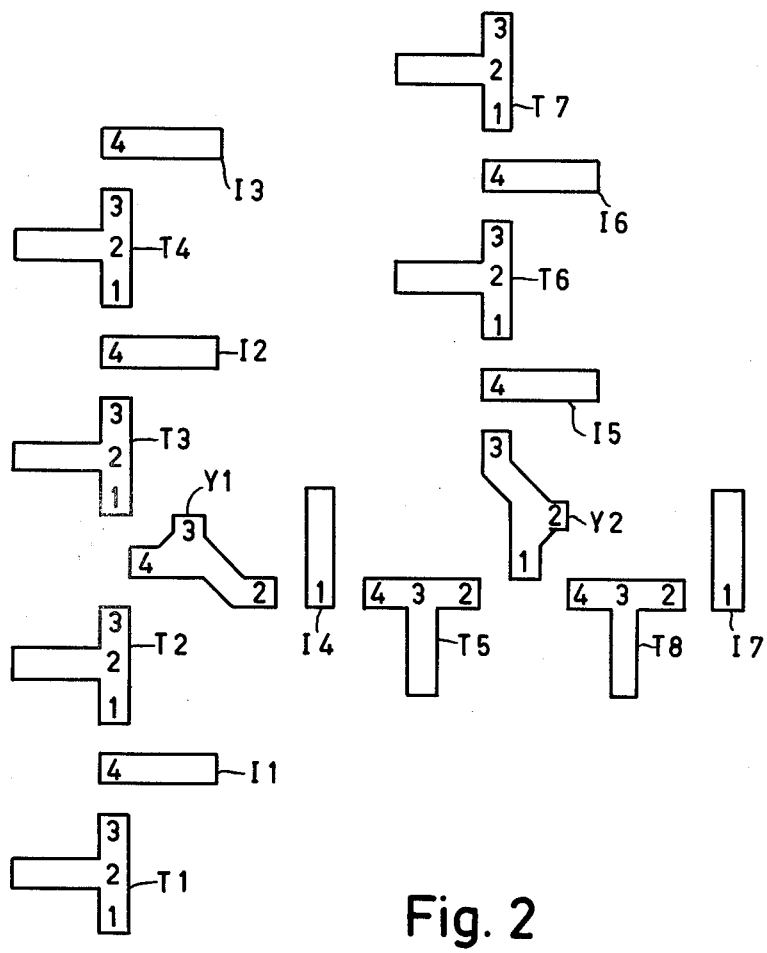
FIG. 2 shows a guide structure, consisting of discrete elements, for magnetic bubbles in such a storage device.

FIG. 2 shows an example of a guide structure, consisting of discrete elements, for magnetic bubbles in a storage device as shown in FIG. 1, comprising diverging switches. The discrete elements may consist of permalloy which is vapour-deposited on the plate of magnetic (not shown) in the form of a T (T1 ... 8), an I(I1 ... 7) or a Y (Y1,2). Other shapes are alternatively possible. The elements may have different orientations. The bubbles on the permalloy may tend to remain on an end which has the same direction as the rotary magnetic field. If this field is directed downwards in the plane of the drawing, a bubble is situated, for example, in position 1 of element T1; notation T11. If the field rotates to the right, the bubble proceeds to position 2 on element T1; notation T12. If the field rotates upwards in the plane of the drawing, the bubble proceeds to position T13, and if the field rotates to the left, the bubble jumps to position 4 on element I1 (notation I14).

During a second period of the rotation, the bubble moves to the positions T21, T22, T23, Y14. The element Y1 forms part of a diverging switch. If the rotary magnetic fields rotates counter-clockwise, the diverging switch at Y1 is in the position "straight forward,"and the bubble proceeds via T31, T32, T33, Y24 ....

If the direction of rotation of the rotary magnetic field is reversed, the movement direction of the bubble also changes: it returns, for example, from position T22, via position T21, ... , to position T11. If Y14 is passed during the return movement, the next position will be Y13 rather than T23 because the former is nearer. This "nearness" need not be a property of the geometry, but is codetermined by the magnetic properties of the permalley. The next positions will then be Y13, Y12, I41 . .. Y21, so that the rotary magnetic field has been turned back over 7/4 periods. If it subsequently rotates counter-clockwise again, the next positions will be Y22, Y23, I54 .... The diverging switch is then in the position "to the right."If a bubble is in position Y54 and back rotation takes place during 7/4 periods, it proceeds to the position I71, so that a further bubble can readily proceed to the position Y21. The element Y1 and its environment thus act as a diverging switch. If a bubble is present in one of the positions Y14 . . . T52, and the rotary magnetic field rotates counter-clockwise, the bubble ultimately proceeds in the direction of the position I34. The element Y1 and its environment can thus also act as a converging switch. Other rotary field sequences are alternatively possible, notably if more bubbles are involved: for example, by 11/4 periods of back rotation, two bubbles can be deflected together from positions I21, Y14, to Y21, I71, respectively. In the present example the discrete element 17 is the last one. If further elements are provided, the element Y2 can also act as a diverging switch (input from T5, outputs to I5 and T8), or as a converging switch (inputs from T5 and I5, output to element T8). The diverging switches can be actuated from four different orientations of the rotary magnetic field (only 2 are shown). The diverging switch at Y1 is operated by reversing the direction of rotation of the rotary magnetic field for 7/4 periods: the direction of rotation is then changed twice. If the series of elements T8,17 continues further, there are in fact two successively connected diverging switches which can each be operated by one reversal of the direction of rotation of the rotary magnetic field. Other forms of diverging switch are also known.

Figure 3:
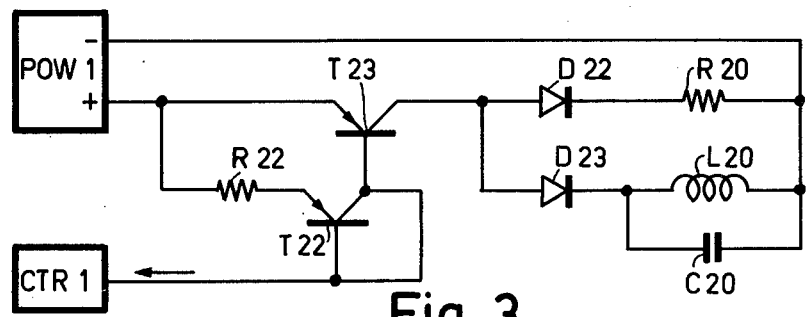
FIG. 3 shows a first embodiment according to the invention.

FIG. 3 shows a first embodiment according to the invention which can be used in a device as shown in FIGS. 1 and 2, or in other devices in which time-dependent currents are to be passed through a coil. The device comprises a power supply POW1, a control unit CTR1, two transistors T22, 23, a coil L20, a capacitor C20, two diodes D22,23, and two resistor R20,22. With the exception of the control unit CTR1 and the coil L20, all elements can form part of a rotary magnetic field generator such as DRI1 of FIG. 1. The base current of the transistor T22 (towards CTR1) renders the transistor T23 conducting such that a current source having a high internal impedance is formed. This controllable current source circuit is known as a "current mirror."The resistor R22 can possibly be omitted. Other such circuits are known which comprise, for example, three transistors. Completely different controllable current source circuits are also known per se.

In the stationary condition the transistor T23 is conducting. If the coil L20 is a magnetic coil for generating a component of the rotary magnetic field in a device according to FIG. 1, the bubbles are positioned in well-defined locations without being substantially disturbed by irregularities in the plate of magnetic material or the bubble guide structure. If the transistor T23 is cut off by a control current signal from the control unit CTR1, the current through the coil L20 first slowly decreases and subsequently decreases ever faster according to a cosine function. The energy of the magnetic field is then stored in the capacitor C20: the voltage thereof reverses its sign and can become much higher than in the stationary condition. Diode D23 remains actuated in the forward direction, but diode D22 is actuated in the reverse direction: the transistor T23 remains cut off, however. During the second quarter of a period, the current in the coil reverses its direction. If the circuit formed by L20 and C20 has only low losses, it regains substantially its original absolute value: the voltage of capacitor C20 has then substantially disappeared. During the third quarter of a period, the current decreases again and the voltage across the capacitor increases again, however, with the same sign as in the stationary case. However, the diode D23 is then actuated in the reverse direction. During the fourth quarter of a period the current in the coil increases again and reaches substantially its original value and direction. During the second half period (diode D23 is then in a blocking state, the transistor T23 can be rendered conducting again by a further control current signal. If the voltage across the capacitor C20 regains its original polarity, the current through the transistor T23 can be superimposed on the oscillating current in the circuit. As a result, both diodes D22, 23 can be actuated in the forward direction, with the result that the resistor R20 now forms part of the parallel circuit. If this resistor has the value:

$$R20 = \tfrac{1}{2} \sqrt{L20/C20}$$

the circuit is critically damped and no ringing phenomena occur after one period. Consequently, a next period can be started briefly after the first period, whilst the current levels remain determined by the controllable current source circuit. If the losses are small, the circuit can also perform, for example, 2 periods in that the transistor T23 is rendered conducting again only in the fourth half period. The tolerance as regards the instant of the restarting of the transistor T23 amounts to approximately one half period of the natural frequency of the circuit. If the device is used in a store comprising magnetic bubbles and the store has been in the rest condition for a long period of time, the current in the coil L20 can be attenuated and the dissipation reduced by a changed control signal.

Figure 4:
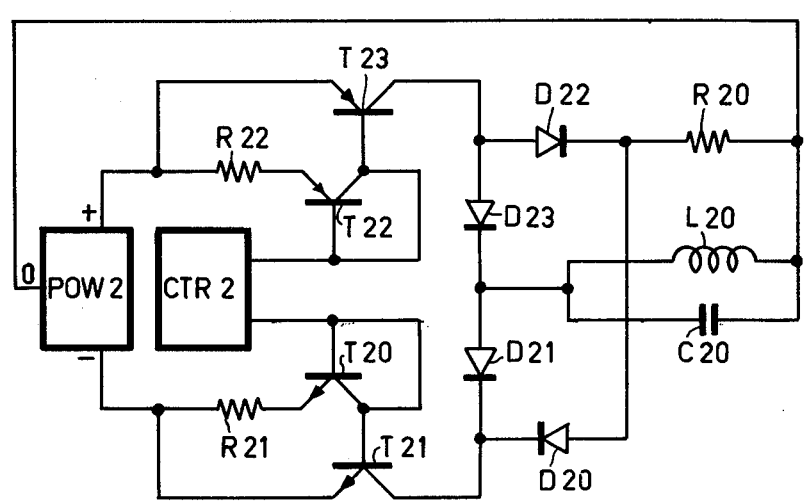
FIG. 4 shows a two-way embodiment according to FIG. 3.

FIG. 4 shows a two-way embodiment of FIG. 3 new elements being the control unit CTR2, the power supply POW2, the transistors T20,-T21, the resistor R21, and the diodes D20,23. The circuit can first of all be operated analogously with that of FIG. 3, transistor T21 being continuously cut off and transistor T22 being cut off for a period of time of between one half and one whole period of the natural frequency of the oscillator circuit. Like the series connection of the diodes D22,23 which first isolated the resistor R20 from the freely oscillating circuit in both directions, the series connection of the diodes D20,21 has the same effect. The circuit can also operate when the transistor T23 is continuously in the cut-off state, transistor T21 being cut-off for a period of time of between one half and one whole period of the natural frequency of the circuit. Furthermore, for example, transistor T23 may be initially conducting and transistor T21 cut off. A first control current signal then cuts off also transistor T23, with the result that a first half period of the oscillation is started. If the transistor T21 is then rendered conducting by a second control current signal within one half period, only one half period is completed: the transistor T21 takes over the conduction. The first and the second control current signal can simultaneously appear. Possible applications in view of the generation of a rotary magnetic field will be described hereinafter. The maximum voltage across the transistors T21,23 is substantially equal to the peak voltage across the capacitors. The voltage across the transistors T20,22 is comparatively low.

Figure 5:
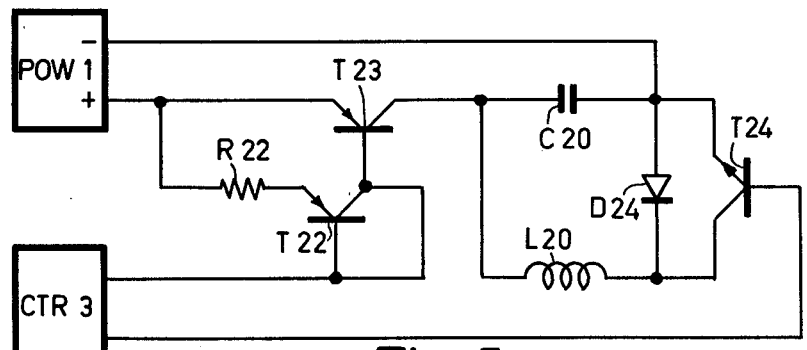
FIG. 5 shows a second embodiment according to the invention.

FIG. 5 shows a second embodiment according to the inventions comprising, in addition to the elements already stated with reference to FIG. 3, the control unit CTR3, a transistor T24 and a diode D24. The function of the elements T22,23 and R22 is now slightly different.

In the stationary state, transistor T24 is cut off. The base electrode of transistor T22 receives a control current, but the coil L20 does not carry a current because of the blocking action of the diode D24 and the transistor T24. When a control signal is applied to the base electrode of transistor T24, the latter becomes conducting. As a result, a current which increases in time flows through the coil L20 according to the first quarter of a period of a sine function. This current is delivered by the capacitor C20, with the result that the potential thereon decreases according to a cosine function. During the second quarter of a period, the current through the coil L20 decreases again according to the sine function, and the capacitor C20 is charged again at the opposite polarity. Until this instant the diode D24 is actuated in the reverse direction. During the third half period, the current in the coil L20 reverses its direction, because the diode D24 is then connected in the forward direction. After the coil has conducted a negative-going maximum current, this current becomes smaller again in the fourth quarter of a period until the capacitor has been charged to the output voltage again, disregarding small losses. During the second half period, the current flows through the diode D24 and opposite to the forward direction of the transistor T24. During the said second half period, the control signal on the base electrode of transistor T24 may be terminated: in that case one period is completed by the oscillator circuit. After this period, a current pulse provided by the transistor T23 charges the capacitor C20 to the output voltage. After a brief period of time, the circuit is ready again for a next cycle. The transistor T23 carries the largest voltage difference, i.e., twice the supply voltage.

The circuits of FIGS. 3 to 5 can supply current amplitudes of, for example, 3A in an inductance of 20 μ/H at a frequency of 100 kHz.

Figure 6:
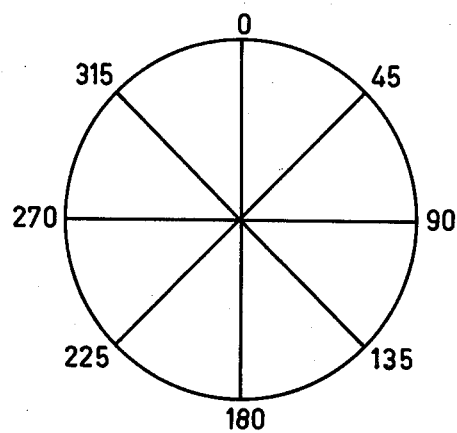
FIG. 6 shows a phase-diagram of a rotary magnetic field to be generated.

FIG. 6 shows a diagram in the form of a wind rose of rotary magnetic field directions to be generated. The directions are indicated in degrees with respect to a reference direction. When a rotary magnetic field is generated, various possibilities exist. First of all, the rotary magnetic field can continuously rotate in a plane at the same direction of rotation, for example, continuously counter-clockwise. The following is then a feasible combination:

a. a device as shown in FIG. 3, having the orientation 0° (the orientation is defined as the direction of the axis of the coil of the oscillator circuit).

b. a device according to FIG. 5, having the orientation 90°. The end of a period then always occurs at the orientation of the rotary magnetic field toward 0° (possibly 180°); in this position the rotary magnetic field can remain stationary for a longer or shorter period. A cycle is controlled in that the two oscillators complete one period exactly simultaneously.

A second pissibility consists in that the magnetic field has two directions of rotation, a reversing point being situated at 0° or at 90°. The following combination is then suitable:

a. a device according to FIG. 3, having the orientation 45°;

b. a device according to FIG. 4. having the orientation 135°. In the rest state there is a component of the rotary magnetic field in the 45° direction; the other component has the 135° or 315° direction. If they are equally strong, these components together produce a rest magnetic field having the orientation 90° or 0°, respectively. If the device according to FIG. 4 then completes one half period, the orientation of the rotary magnetic field changes from 0° to 90° via the position 45°.

If the orientation of the rest magnetic field is 0° and the device according to FIG. 3 completes a full period, the device according to FIG. 4, however, completing one half period at a 90° phase lag, the orientations of the rotary magnetic field can be found as follows:

| After .. periods | Orientation FIG. 3 | Orientation FIG. 4 | total |
|---|---|---|---|
| 0 | 45° | 315° | 0° |
| ¼ | — | 315° | 315° |
| ½ | 225° | — | 225° |
| ¾ | — | 135° | 135° |
| 1 | 45° | 135° | 90° |

An angle of 270° is thus completed, be it not at a uniform speed. A angle of 270° can also be completed in the other direction in a corresponding manner. In order to complete an angle of 360°, both devices can complete a full period at a 90° phase difference. Like in the foregoing, the speed is lower during the first and the last parts of the rotation than during the other parts (i.e., the rotation is not uniform).

A third possibility for use consists in that the magnetic field can rotate in two directions, whilst each of the four orientations 0°, 90°, 180° and 270° can act as a reversing point. A possible combination is two devices according to FIG. 4, having the orientations 45° and 135°, respectively. In the rest state the field is directed according to one of the four wind directions (0°, 90° or 270°). From each of these four directions two rotations are possible, such as described for two possible reversing points in the foregoing. As above, a rotation over 180° is performed as follows:

| After .. periods | Orientation A | Orientation B | Total |
|---|---|---|---|
| 0 | 45° | 315° | 0 |
| ¼ | — | 315° | 315° |
| ½ | 225° | — | 225° |
| ¾ | 225° | 135° | 180° |

The number of periods is again expressed in periods of the natural frequency of the oscillator circuit.

A fourth possible use consists in that the rotary magnetic field has two directions of rotation, whilst each of the eight orientations 0°-45°-90°-135°-180°-225°-270°-315° can act as a reversing point. A possible combination comprises four devices according to FIG. 4 which pair-wise have the orientations 45° and 135°, respectively. If the rest field has the orientation 90°, the individual orientations are 45°-45°-135°. If the first two or the last two are actuated, the magnetic field rotates in the directions of 135° or 45°, respectively. If the rest magnetic field has the orientation 45°, the individual orientations are 45°, 45°, 135°, 315°. If the third component is reversed, the field rotates to 0°; if the fourth component is reversed the field rotates to 90°. Other systems can also be realized according to the invention.

What is claimed is:

1. A device for generating a time-dependent current, comprising:

first, second and third connection terminals of different potentials;

said second terminal having a potential intermediate than that of said first and third terminals;

an oscillator circuit, having first and second connection points;

two control elements each forming a controllable current source connected to said first and third terminals respectively, each of said control elements connected in series with a rectifying element, each of said rectifying elements being connected to a first connection point of said oscillator circuit, said second connection point of said oscillator circuit being connected to said second current connection terminal.

2. A device for generating a rotary magnetic field comprising:

two coils spatially arranged so that the magnetic fields generated by a current through the coils are transverse to each other; and current driving means connected to each of said coils for producing a time-dependent current therein, comprising first, second and third connection terminals of different potential; said second terminal having a potential intermediate than that of said first and third terminals; an oscillator circuit, having first and second connection points and including one of said coils connected therebetween; and two control elements each forming a controllable current source connected to said first and third terminals respectively, each of said control elements connected in series with a rectifying element, each of said rectifying elements being connected to a first connection point of said oscillator circuit, said second connection point of said oscillator circuit being connected to said second connection terminal.

3. A device for generating a rotary magnetic field, comprising:

first and second coils spatially arranged so that the magnetic fields generated by a current through the coils are transverse to each other, and first and second current driving means for said first and second coils, respectively;

said first driving means comprising at least two current connection terminals of different potential; a first oscillator circuit comprising a capacitor and said first coil connected in parallel; a first rectifying element connected in series with said oscillator circuit; and a current control device connected in series between one of said current connection terminals and said rectifying element; and said second driving means comprising first, second and third connection terminals of different potentials; said second terminal having a potential intermediate than that of said first and third terminals; a second oscillator circuit having first and second connection points and including said second coil therebetween; and two control elements each forming a controllable current source connected to said first and third terminals respectively, each of said control elements connected in series with a second rectifying element, each of said second rectifying elements being connected to a first connection point of said second oscillator circuit, said second connection point of said second oscillator circuit being connected to said second terminal.

4. A device for generating a rotary magentic field comprosing two coils spatially arranged so that the magnetic fields generated by a current through the coils are transverse to each other; and current driving means connected to each of said coils for producing a time-dependent current therein, comprising:

first and second current connection terminals of different potential;

an oscillator circuit connected to said first terminal and comprising a capacitor and one of said coils connected in parallel;

a first rectifying element connected in series with said oscillator circuit;

a current control device comprising a transistor, having a first terminal connected to said second current connection terminal and a second terminal connected to said first rectifying element, and connected in series therebetween;

a second rectifying element conductive in the same direction as said first rectifying element, connected in parallel with said first rectifying element and said oscillator circuit for damping the current produced by said oscillator circuit; and a resistor connected in series with said second rectifying element for diminishing power loss and damping unwanted oscillations.

* * * * *